United States Patent [19]

Narayan et al.

[11] Patent Number: 5,659,153

[45] Date of Patent: Aug. 19, 1997

[54] THERMOFORMED THREE DIMENSIONAL WIRING MODULE

[75] Inventors: Chandrasekhar Narayan, Hopewell Junction, N.Y.; Jane Margaret Shaw, Ridgefield, Conn.

[73] Assignee: International Business Machines Corporation, Armonk, N.Y.

[21] Appl. No.: 398,327

[22] Filed: Mar. 3, 1995

[51] Int. Cl.$^6$ .................................................. H05K 1/02
[52] U.S. Cl. ............................................ 174/255; 174/250
[58] Field of Search ..................................... 174/254, 255, 174/250; 361/749; 439/67, 77

[56] References Cited

U.S. PATENT DOCUMENTS

| | | | |
|---|---|---|---|
| 3,875,478 | 4/1975 | Capstick | 317/101 CC |
| 4,528,748 | 7/1985 | Eichelberger et al. | 29/835 |
| 4,687,695 | 8/1987 | Hamby | 428/192 |
| 4,800,461 | 1/1989 | Dixon et al. | 361/398 |
| 5,206,463 | 4/1993 | DeMaso et al. | 174/254 |
| 5,259,110 | 11/1993 | Bross et al. | 29/830 |
| 5,264,061 | 11/1993 | Juskey et al. | 156/214 |
| 5,408,052 | 4/1995 | Inaba et al. | 174/261 |
| 5,516,989 | 5/1996 | Uedo et al. | 174/254 |

FOREIGN PATENT DOCUMENTS

| | | |
|---|---|---|
| 0477981 | 4/1992 | European Pat. Off. . |
| 4290495 | 3/1993 | Japan . |

Primary Examiner—Laura Thomas
Attorney, Agent, or Firm—Perman & Green, LLP

[57] ABSTRACT

The present invention provides a wiring module containing a plurality of laminated polymer layers containing defined electronic circuitry which can be thermoformed into desired three dimensional shapes without damaging the internal wiring at the region of thermoform stress. More particularly, the invention provides a thermoformed, three dimensional wiring module prepared by thermoforming a laminate comprising a plurality of laminated, thermoformable polymer insulating layers containing conductive wiring circuitry on at least one surface of the layers, the layers being assembled to form conductive interconnect paths within the module, the module further characterized in that the conductive wiring circuitry is present only on internal low stress layers of the laminate at the region of thermoformed bends present in the module.

14 Claims, 1 Drawing Sheet

THERMOFORMED THREE DIMENSIONAL WIRING MODULE

BACKGROUND OF THE INVENTION

1. Field of the Invention

The invention relates to thermoformed, three dimensional wiring modules containing high density conductive wiring.

2. Description of the Related Art

Multilayer wiring modules, e.g. circuit boards, circuit substrates or circuit memory cards, are known in the electronics industry as a base to provide conductive paths among various electronic components present in a computer system. The common modules comprise a plurality of layers which are fabricated to contain a conductive wiring pattern on one or both of the layer surfaces, including a number of electrically conductive vias formed through at least some of said layers such that when a plurality of such layers are laminated together in appropriate alignment using heat and/ or pressure, useful electrically conductive interlayer pathways are formed within the module. A typical planar module formed from layers of thermoplastic polymer materials is disclosed in U.S. Pat. No. 5,259,110, the complete disclosure of which is incorporated herein by reference.

In some applications, it is desirable to provide thermoformed, three dimensional modules such as, for example, disclosed in U.S. Pat. Nos. 4,528,748 and 5,264, 061. Three dimensional modules are particularly desirable for use as interchangeable computer circuit cards. Circuitry may also be present in the molded plastic housing of small computers such as the computer case of a lap top, which housing itself can then serve as a circuit board and interconnect, providing a lighter weight and more efficient computer package.

It is extremely difficult to form precise and desirably dense circuit patterns on three dimensional, non-planar substrates by conventional pattern-forming technology such as thin film lithography, electroless plating or screen printing techniques, because of light and mechanical distortion problems which arise when dealing with a non-planar surface.

An obvious solution to this problem with respect to modules fabricated from thermoplastic polymers would be to first construct the multilayer interconnect system in the planar state and then thermoform the defined module into the desired three dimensional shape. However, the thermoforming process puts undue stress on the internal wiring present in the module, particularly wiring present on the outer layers of the module opposite the inner angle of bend. This can lead to breakage or shorting of the circuit in these regions as consequence of stress bending encountered in the thermoforming process.

SUMMARY OF THE INVENTION

The present invention provides a wiring module containing a plurality of laminated polymer layers containing defined electronic circuitry which can be thermoformed into desired three dimensional shapes without damaging the internal wiring at the region of thermoform stress. More particularly, the invention provides a thermoformed, three dimensional wiring module prepared by thermoforming a laminate comprising a plurality of laminated, thermoformable polymer insulating layers containing conductive wiring circuitry on at least one surface of the layers, the layers being assembled to form conductive interconnect paths within the module, the module further characterized in that the conductive wiring circuitry is present only on internal low stress layers of the laminate at the region of thermoformed bends present in the module.

DETAILED DESCRIPTION OF THE INVENTION

Figure 1:
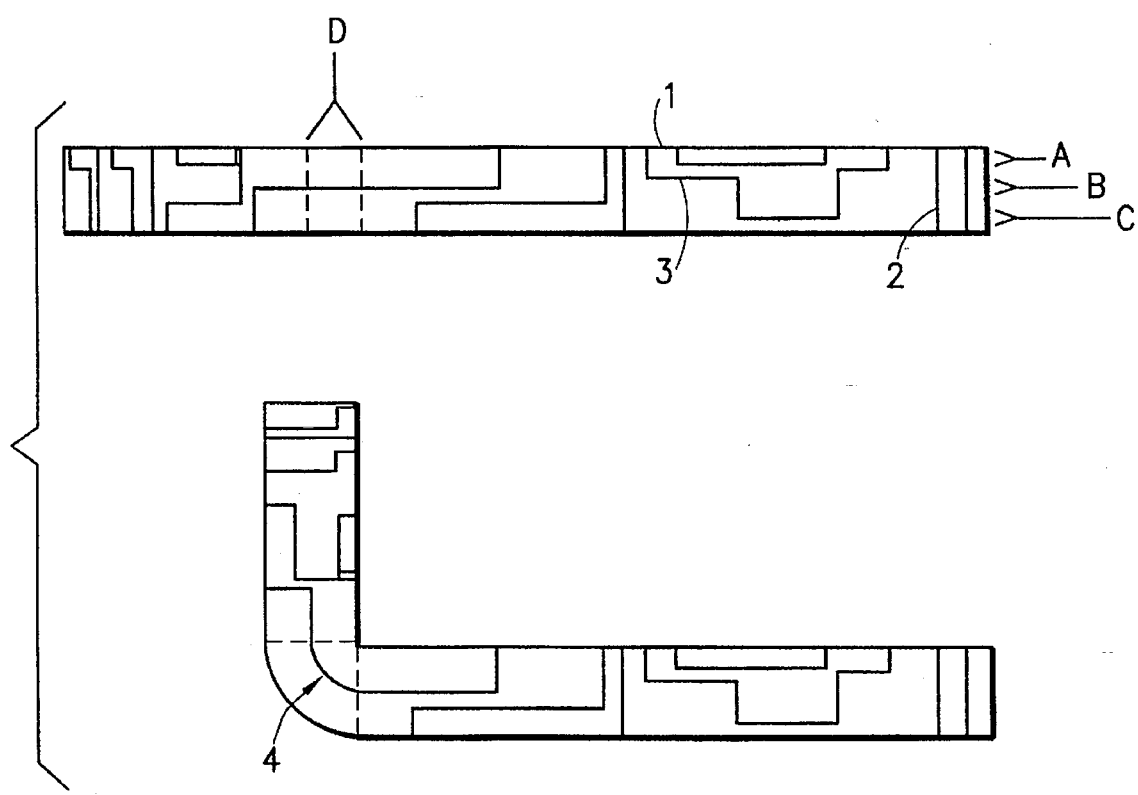
FIG. 1 is a schematic side sectional view of a wired planar electronic module of this invention, both prior to thermoforming and the same module in three dimension after thermoforming.

The wiring modules of the present invention are prepared by forming conductive wiring circuitry on one or both sides of sheet materials composed of a thermoformable polymer. The circuitry may comprise a series of conductive lines having a line density in the range of 10 to 100 lines per linear inch per layer, and may also include patterned vias or holes punched in the sheet and adapted to be filled or plated with conductive metal, e.g. solder, to form conductive interlayer interconnects after the sheets are laminated.

The polymeric sheet material used to fabricate the wiring module may include any thermoformable polymer material which has reasonably good electrical insulating properties. Suitable polymers include thermoplastics such as polyolefins, e.g. polypropylene and polyethylene, polystyrene and copolymers of styrene with acrylonitrile or with butadiene and acrylonitrile (ABS resins), polyesters such as are available from Hoechst Celanese under the VECTRA® tradename; polyvinyl or vinylidene chloride, polycarbonates, polysulfides, polyphenylene ethers, polyacrylics such as polymethylmethacrylate and like materials. Also suitable are "B" stage polyamic acids which will cure upon the application of heat applied during the thermoforming process. The sheets may also contain non-conducting, reinforcing fillers such as fiberglass or polyamide fibers. Preferably, the sheet layers have a thickness in the range of about 1 to 10 mils, more preferably from about 4 to 6 mils.

Conductive wiring patterns are formed on one or both surfaces of each sheet by any suitable known technique. Such techniques include screen printing of metallic conductive ink, plating the sheet with a film of a conductive metal such as copper, silver, aluminum or cooper-chromium and thereafter forming the conductive wiring pattern using computer controlled etching of the metal or using the more conventional photoresist pattern exposure followed by development and mask etching of the metal. Other methods include the decal process or a sputtering process. Connecting vias may also be drilled at selective regions of the circuit pattern and filled or plated with conductive metal during fabrication of the module lamination as is known in the prior art.

After the sheets are electrically configured, they are stacked in appropriate electrical registration such that the desired conductive interconnect paths are established throughout the laminated structure. If desired, a suitable adhesive, e.g., a thermoplastic low melting polymer, may be applied between adjacent sheets to assist bonding. The stacked sheets are then subjected to moderate thermal compression, during which process the thermoplastic properties of the sheets or of any adhesive which may be applied between adjacent sheets cause the sheets to bond together to provide a multilayer, planar module of mechanical integrity.

The key feature of the present invention relates to the design of the conductive wiring patterns applied to each layer of the laminated structure in those regions of the module which will be stressed or bent when the module is thermoformed into a three dimensional shape. In addition to the requirement that the circuitry present in each layer be configured such as to provide conductive wiring interconnect paths within the assembled laminate, it is also configured such that the wiring which transverses or traverses planned stress regions of the laminate is present only in the internal or low stress layers of the laminate, such as illustrated in FIG. 1.

FIG. 1 shows in the top figure a schematic side sectional view of a wired module or laminate 1 having a number of conductive vias illustrated by vertical lines such as 2 and a number of conductive wires illustrated by horizontal lines such as 3. The bottom figure shows the same module after having been thermoformed with an "L" shaped 90° bend. The top figure illustrates the region of stress at D where the thermoformed bend will be formed in the module. The layers present in region A of the cross-section will thus be subjected to compressive thermoform stress while the layers present in region C of the cross-section will be subjected to stretching thermoform strain. Layers present in the core region B will be subjected to the lowest thermoform stress and strain. Thus, any wiring present at region D is present only on and between internal layers which are located within region B of the cross section of the laminated structure, such as shown at 4 in FIG. 1.

Low stress and strain inner or core region B preferably occupies not more than 35% of the thickness of the laminate, more preferably not more than 25% and most preferably not more than 15% of such thickness.

Modules commonly used in the electronics industry may contain from 2 to about 20 wired laminate layers, more commonly from 4 to 12 of such layers. Thus, in a two layer structure of the invention, the wiring circuitry would be present only at the interface of the first and second layers at the region of planned thermoform bends, i.e., region D shown in FIG. 1. With respect to structures containing ten layers, the wiring at the bend could be present on one or more surfaces where layers 4, 5, 6 and 7 interface, but would be more preferably present only at the interface of layers 5 and 6. Thus, the wiring circuitry at the region of thermoform bend for laminates containing four or more even number of n layers is such that the wiring circuitry is present only on one or more surfaces of the n/2 and/or the (n/2+1) layers, more preferably only at the interface between the n/2 layer and the (n/2+1) layer of the laminate.

For structures containing three or more odd number of m layers, the wiring circuitry present at the region of thermoform bend would be preferably present only at the interface of the (m+1)/2 layer with one or both adjacent layers, more preferably only at the interface of the (m+1)/2 layer with one adjacent layer.

Three dimensional modules of the invention may be prepared by heating the planar laminate to a temperature at or slightly above the glass transition temperature of the polymer material of which the module layers are composed, and shaping the module into the desired three dimensional configuration. Preferred thermoform techniques include hot press molding or vacuum forming methods. Cross-sectional thermoformed bends formed in the resulting three dimensional module may range from angles of about 1° to about 135° from the horizontal, more preferably from about 5° to 90° from the horizontal, without destroying or shorting out the core circuitry configured in accordance with the invention.

Depending upon the anticipated uses of the modules of this invention, external auxiliary flex conductive wiring can also be applied to the modules during assembly of the electronic device of which the modules form a part.

What is claimed is:

1. A thermoformed, three dimensional wiring module prepared by thermoforming a laminate comprising a plurality of laminated, thermoformable polymer insulating layers containing conductive wiring circuitry composed of conductive metal on at least one surface of said layers, said layers assembled to form conductive interconnect paths within said module, said module further characterized in that the conductive wiring circuitry is present only on internal, low stress layers of said laminate at the region of thermoformed bends of said module.

2. The module claim 1 comprising a two layer laminate and wherein the wiring circuitry is present only at the interface of said layers at said region.

3. The module of claim 1 comprising an even number of n layers of four or more, and wherein said wiring circuitry is present only on one or more surfaces of the n/2 layer, the (n/2)+1 layer or both the n/2 and (n/2)+1 layers.

4. The module of claim 3 wherein said wiring circuitry is present only at the interface between said n/2 layer and (n/2+1) layer at said region.

5. The module of claim 3 containing up to 12 layers.

6. The module of claim 1 comprising an odd number of m layers of three or more, and wherein said wiring circuitry is present only at the interface of the (m+1)/2 layer with one or both adjacent layers at said region.

7. The module of claim 6 wherein said wiring circuitry is present only at the interface of said (m+1)/2 layer with one adjacent layer at said region.

8. The module of claim 6 containing up to 11 layers.

9. The module of claim 1 wherein said thermoformed bends range from an angle of about 1° to about 135° from the horizontal.

10. The module of claim 9 wherein said thermoformed bends range from an angle of from about 5° to 90° from the horizontal.

11. The module of claim 10 wherein said thermoformed bends are at an angle of about 90° from the horizontal.

12. The module of claim 1 wherein said internal low stress layers are present within the inner 35% cross-sectional thickness of said module.

13. The module of claims 12 wherein said low stress are present within the inner 25% cross-sectional thickness of said module.

14. The module of claim 12 wherein said low stress layers are present within the inner 15% cross-sectional thickness of said module.

* * * * *